United States Patent
Potter

(10) Patent No.: US 6,265,900 B1
(45) Date of Patent: Jul. 24, 2001

(54) HIGH SPEED LOGICAL OR CIRCUIT

(75) Inventor: Dale A. Potter, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/288,062

(22) Filed: Apr. 7, 1999

(51) Int. Cl.$^7$ .................. H03K 19/094; H03K 19/20
(52) U.S. Cl. .................. 326/121; 326/112; 326/119; 326/104; 326/106
(58) Field of Search .................. 326/83, 17, 20, 326/104, 106, 108, 112, 119, 121

(56) References Cited

U.S. PATENT DOCUMENTS

| | | | |
|---|---|---|---|
| 5,432,463 | * 7/1995 | Wong et al. | 326/32 |
| 5,457,404 | * 10/1995 | Sharpe-Geisler | 326/17 |
| 5,661,411 | * 8/1997 | Nguyen | 326/21 |
| 5,841,300 | * 12/1998 | Murabayashi et al. | 326/98 |
| 5,912,900 | * 6/1999 | Durham et al. | 371/22.1 |
| 6,002,292 | * 12/1999 | Allen et al. | 327/379 |
| 6,046,606 | * 4/2000 | Chu et al. | 326/95 |

\* cited by examiner

Primary Examiner—Michael Tokar
Assistant Examiner—Vibol Tan
(74) Attorney, Agent, or Firm—Skjerven Morrill MacPherson LLP

(57) ABSTRACT

A CMOS OR circuit is fast and has a reduced sensitivity to the variations in the process, temperature and voltage supply. When the input signal to any one of a plurality of select transistor is in a logic high, a fixed supply of current is provided to the common drain terminal of the select transistors thereby to limit the amount of voltage swing of the common drain terminal and the common source terminal of the select transistors. A maximum power sensor senses the voltage differential developed between the common drain and the common source terminals of the select transistors and in response thereto generates a control signal which varies the amount of current that a variable current supply delivers to the common drain terminal thereby to prevent the output signal of the OR circuit from switching to the wrong state.

19 Claims, 8 Drawing Sheets

HIGH SPEED LOGICAL OR CIRCUIT

FIELD OF THE INVENTION

The present invention relates to an integrated circuit, more particularly, to a fast OR logic circuit implemented in integrated circuit form.

BACKGROUND OF THE INVENTION

A conventional CMOS OR circuit (e.g. the 3-input OR circuit 10 of FIG. 1) is slow, inhibiting its use in the critical speed path of an Integrated Circuit (IC).

FIG. 2 shows a known 3-input OR circuit 20, which is undesirably slow when designed to be operable under all temperatures, process corners and supply voltages. Furthermore, the speed of OR circuit 20 varies significantly with temperature, process and supply voltage variations.

FIG. 3 shows a computer simulation of a timing delay between input terminal IN1 and output terminal OUT of OR circuit 20, under a nominal operation condition, (i.e. typical process corner, 25° C. and 5 volts supply voltage). Using the midpoint between the positive and the negative supply voltages (i.e. 2.5 volts) to measure the delay, it is seen from FIG. 3 that a delay of 0.36 nsec exists between the time the input signal IN1 crosses the 2.5 volts and the time when output signal OUT crosses the same voltage level. The 0.36 nsec delay is undesirably high for some applications.

Therefore a need exists for a CMOS OR circuit which is relatively insensitive to changes in temperature, process and supply voltage variations and operates at a high speed under a nominal operating condition.

SUMMARY OF THE INVENTION

The high-speed CMOS OR circuit, in accordance with one embodiment of the present invention, includes a select transistor for each input signal, a circuit for supplying a fixed current to the common drain terminals of the select transistors and a maximum power sensor circuit for controlling the amount of current that is supplied by a variable current supply to the common drain terminals of the select transistors.

The fixed current supply turns on only when the OR circuit is in a selected state thereby to limit the voltage swing across the common drain and common source terminals of the select transistors and thus to improve the speed of the OR circuit. A delay circuit formed by a string of inverters receives the voltage signal generated at the output terminal of the OR circuit and supplies an inverted voltage signal to a gate terminal of a PMOS transistor to turn on or turn off the fixed current supply.

To ensure that the OR circuit is fast under all process corners, temperatures and voltage supplies, the maximum power sensor senses the voltage signals across the common drain and common source terminals of the select transistors thereby to adjust the amount of current that the variable current supply supplies to the common drain node.

DETAILED DESCRIPTION

Figure 4:
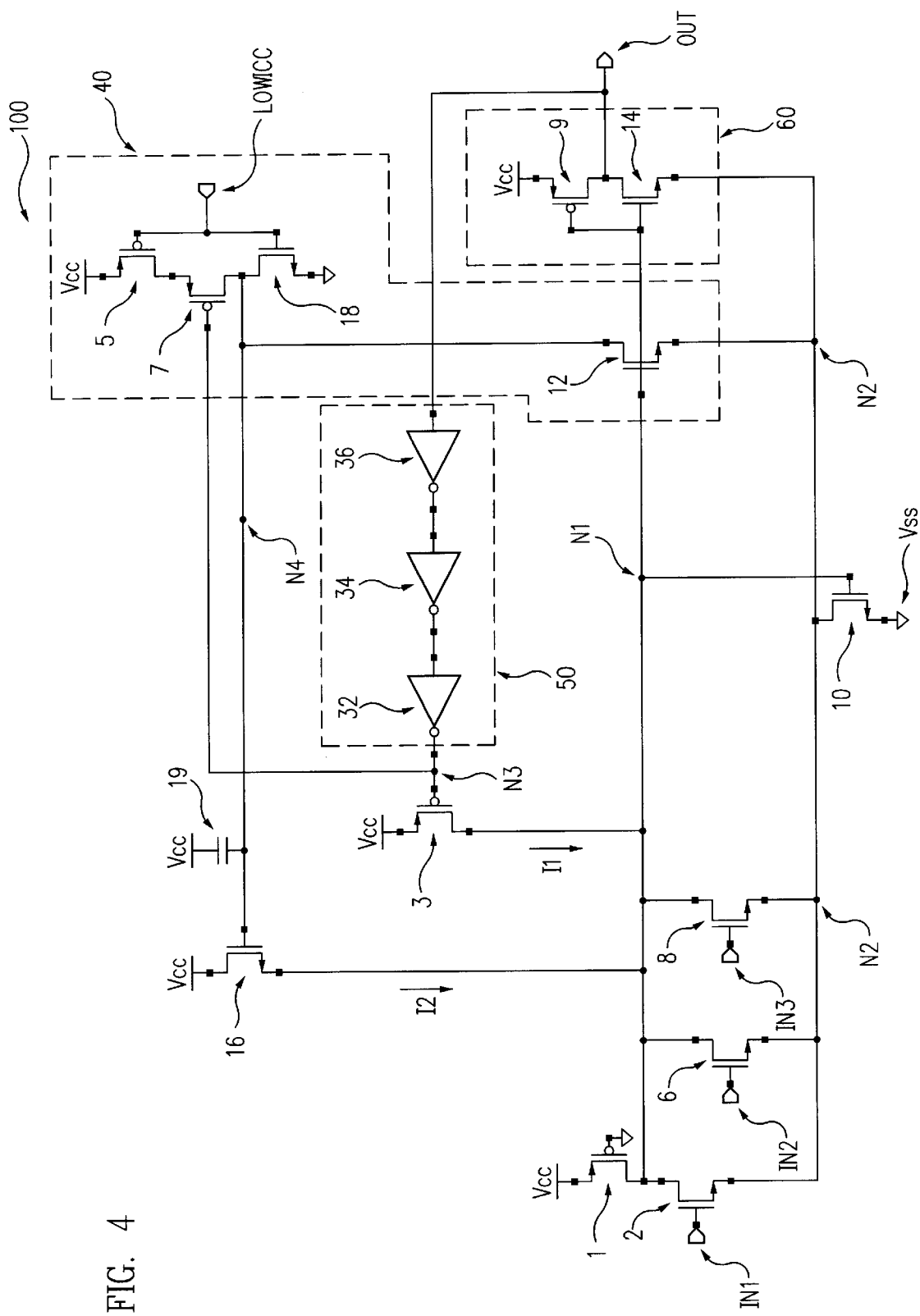
FIG. 4 shows a transistor schematic diagram of a 3-input high-speed CMOS OR circuit, in accordance with one embodiment of the present invention.

A 3-input CMOS OR circuit 100, in accordance with one embodiment of the present invention, is shown in FIG. 4. NMOS transistors 2, 6 and 8 which receive input signals IN1, IN2 and IN3 at their respective gate terminals, have their drain terminals coupled to node N1, which in turn, is coupled to the gate terminal of NMOS transistor 12 and to the input terminal of CMOS inverter 60. The output terminal of inverter 60 generates signal OUT of OR circuit 100.

During normal operation, when at least one of the voltage signals IN1–IN3 goes to a high logic level, (high) node N1 is pulled to a low logic level (low) which, in turn, causes signal OUT to go to a high logic level. On the other hand, when none of the voltage signals IN1–IN3 are at a high logic level, node N1 is at a high logic level, causing voltage signal OUT to go to a low logic level.

As seen from FIG. 4, the drain terminals of select transistors 2, 6 and 8 are coupled to node N1, which is coupled to supply voltage Vcc. Similarly, the source terminals of select transistors 2, 6 and 8 are coupled to node N2, which is coupled to supply voltage Vss. PMOS transistor 3, and NMOS transistors 10 and 16, reduce the amount of voltage swing on relatively high capacitive nodes N1 and N2. PMOS transistor 1 ensures that node N1 is not floating when none of input transistors 2, 6 and 8 are selected and, accordingly, transistor 1 has a relatively narrow channel width and a relatively long channel length.

When none of transistors 2, 6 and 8 are selected, (i.e. all three signals IN1–IN3 are low), node N1 is pulled to supply voltage Vcc, thereby forcing transistor 10 to be in a strong-on state, in turn, pulling node N2 to supply voltage Vss. On the other hand, when at least one of transistors 2, 6 and 8 is selected, (i.e. at least one of signals IN1–IN3 is high), node N1 is pulled low, reducing the gate voltage of transistor 10, thereby forcing transistor 10 to a weak-on state, in turn reducing the conductance by which nodes N1 and N2 are pulled low. Because transistors 3, 16 and 10 limit the amount of voltage variations on relatively high capacitive nodes N1 and N2, transistors 3, 16 and 10 minimize the time delay between the input signals IN1–IN3 and the output signal OUT of OR 100.

As stated earlier, nodes N1 and N2 have relatively large capacitances. Thus, to improve the speed of OR circuit 100, the voltage swing on these two nodes is kept small, in part, by using PMOS transistor 3 whose gate terminal is coupled to node N3. The output terminal of delay circuit 50, which includes a string of three CMOS inverters 32, 34 and 36, is also coupled to node N3. When all three input signals IN1–IN3 are low, node N1 and, consequently, node N3 both are at a high logic level, therefore transistor 3 is off, inhibiting the flow of current I1 from supply voltage Vcc to node N1.

When at least one of signals IN1–IN3 is high, the voltage of node N1 is lowered, therefore, node N3 is pulled low, turning on PMOS transistor 3 which supplies a fixed amount of current I1 to node N1, thus preventing the voltage signal at node N1 to reach to that at node N2. Thus, delay circuit 50 and PMOS transistor 3, by maintaining a DC voltage differential across nodes N1 and N2 when OR circuit 100 is in a selected state, minimize the time period for charging node N1 and discharging node N2 when OR circuit 100 is switched to a non-selected state and thus increase the speed of OR circuit 100. The channel dimensions of PMOS transistor 3 is selected such that under the highest power conditions, namely under the lowest operating temperatures, the highest specified voltage supplies and the fastest processing conditions, the voltage differential between nodes N1 and N2 is still small enough to prevent NMOS transistor 14 from turning on and causing signal OUT to go to a low level.

To achieve the highest speed of operation across different process, temperature and supply voltage variations, while inhibiting the voltage differential from increasing to such levels that would cause transistor 14 to turn on when OR circuit 100 is in a selected state, Maximum Power Sensor (MPS) circuit 40 is provided in OR circuit 100, which is described next.

MPS 40 includes NMOS transistors 12, 18 and PMOS transistors 5, 7. When control signal LOWICC, which is applied to the gate terminals of PMOS transistor 5 and NMOS transistor 18, is at a high logic level, the drain terminal of transistor 18 is pulled to a low logic state, thereby disabling MPS 40 and simultaneously turning off NMOS transistors 16. When signal LOWICC is low, NMOS transistor 18 is switched off and PMOS transistor 5 is switched on, thereby charging the source region of PMOS transistor 7 to supply voltage Vcc. When control signal LOWICC is low, MPS 40 is enabled.

When all three input signals IN1, IN2 and IN3 are low and MPS 40 is enabled, nodes N1 and N3 are both high. Consequently, NMOS transistor 12 is turned on and PMOS transistor 7 is turned off. Therefore, the drain terminal of PMOS transistor 7 is uncoupled from its source terminal (which is at supply voltage Vcc) and is pulled to supply voltage Vss and thus no current flows through MPS 40.

When at least one of the input signals IN1–IN3 goes high and MPS 40 is enabled, the voltage level at node N1 begins to fall. Thereafter, transistor 3 begins to provide current I1 to node N1 to maintain a voltage differential between nodes N1 and N2. If the voltage differential between nodes N1 and N2 is smaller than the threshold voltage of transistor 12, transistor 12 remains off. Accordingly, node N4 is pulled to supply voltage Vcc causing transistor 16 to turn on which supplies a maximum possible amount of current I2 to node N1. If, on the other hand, the voltage differential between nodes N1 and N2 is greater than the threshold voltage of transistor 12, transistor 12 turns on to decrease the voltage at node N1 thereby ensuring that transistor 14 turns off. Because, both PMOS transistors 5 and 7 as well as NMOS transistor 12 are on, the magnitude of the voltage drop at node N1 is dependent on the relative sizes of PMOS transistors 5, 7 and NMOS transistor 12. In a steady state, the voltage at node N4 decreases to a value between the supply voltage Vcc and the voltage at node N2. The decrease in the voltage at node N4 causes the gate voltage of transistor 16 to go down, reducing the current I2, and thereby reducing the voltage at node N1. The greater the voltage differential between nodes N1 and N2 becomes, the stronger the on-state of transistor 12, the greater the reduction in the voltage at node N4, and hence the smaller is the magnitude of current I2 delivered to node N1. Conversely, the smaller the voltage differential between nodes N1 and N2 becomes, the weaker the on-state of transistor 12, the smaller the reduction in voltage at node N4, and hence the greater is the magnitude of current I2 delivered to node N1.

Figure 8:
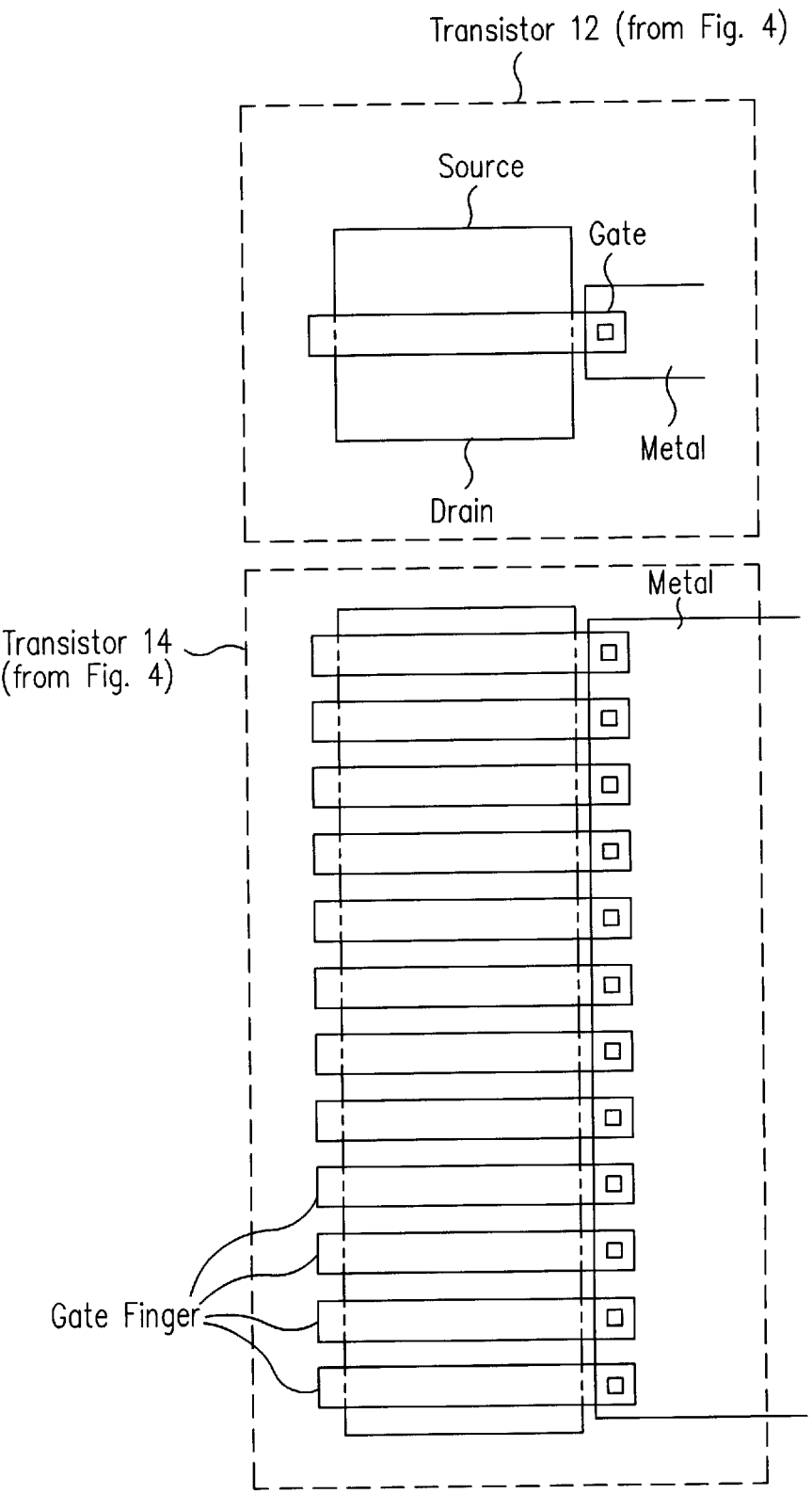
FIG. 8 shows a top view of the physical layout of two of the transistors of the OR circuit of FIG. 4.

To ensure that the threshold voltages of NMOS transistors 12 and 14 track each other when variation in fabrication processing occurs, transistors 12 and 14 are placed adjacent each other and have similar layout and physical orientation. As seen from FIG. 8, because transistor 14 typically has a much wider channel than transistor 12, transistor 14 is physically laid out using multiple gate fingers, each having the same size as that of the gate of transistor 12.

MPS 40 by sensing the voltage of node N1 and accordingly adjusting the gate voltage of transistor 16, in accordance with the present invention, increases the speed and simultaneously minimizes the sensitivity of OR 100 to process, temperature and power supply variations.

Delay circuit 50, ensures a delay before signal OUT is applied to the gate terminal of transistor 3, thereby stabilizing OR circuit 100.

Inverter 60, inverts the voltage signal of node N1 and delivers it to the output terminal OUT of OR circuit 100.

In one embodiment of the present invention capacitor 19 is disposed between node N4 and supply voltage Vcc to stabilize OR circuit 100 and to inhibit oscillation. If the inherent capacitance of node N4 is sufficient to stabilize OR circuit 100, capacitor 19 is unnecessary.

In one embodiment of the present invention, the transistor sizes of OR circuit 100 are as shown in the following table, where channel width is designated as W and channel length is designated as L.

| Transistor No. | W ($\mu$m) | L ($\mu$m) |
|---|---|---|
| 1 | 2.0 | 2.0 |
| 2 | 11.2 | 0.7 |
| 3 | 5.4 | 0.75 |
| 4 | 22.4 | 0.7 |
| 5 | 1.4 | 1.0 |
| 6 | 9.0 | 0.7 |
| 7 | 1.4 | 1.0 |
| 8 | 9.0 | 0.7 |
| 9 | 40.2 | 0.75 |
| 10 | 15.8 | 0.8 |
| 12 | 3.0 | 0.7 |
| 14 | 36.0 | 0.7 |
| 16 | 14.0 | 0.7 |
| 18 | 1.4 | 1.0 |

Figure 1:
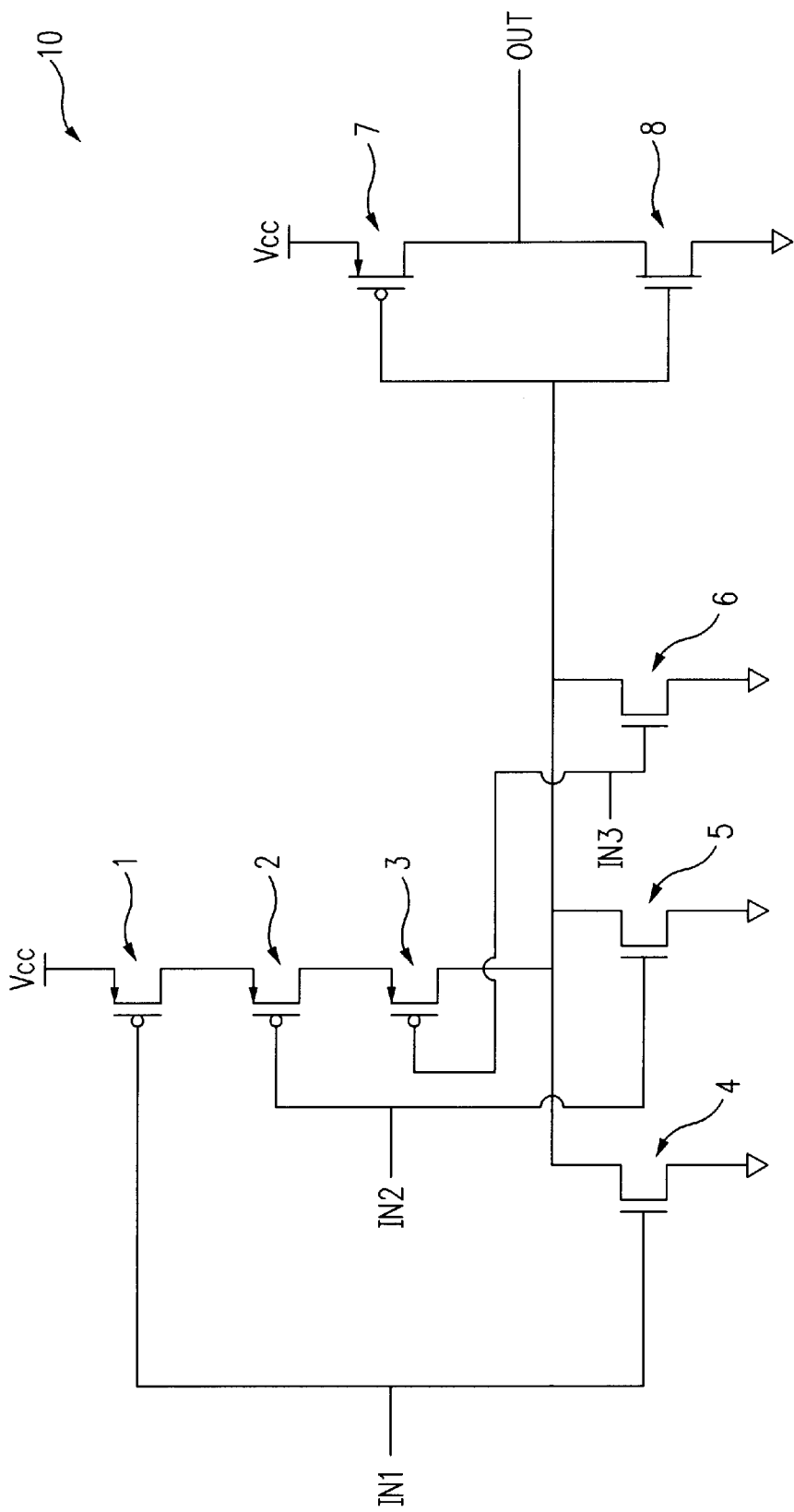
FIG. 1 shows a transistor schematic diagram of a 3-input CMOS OR circuit as known in the prior art.
Figure 2:
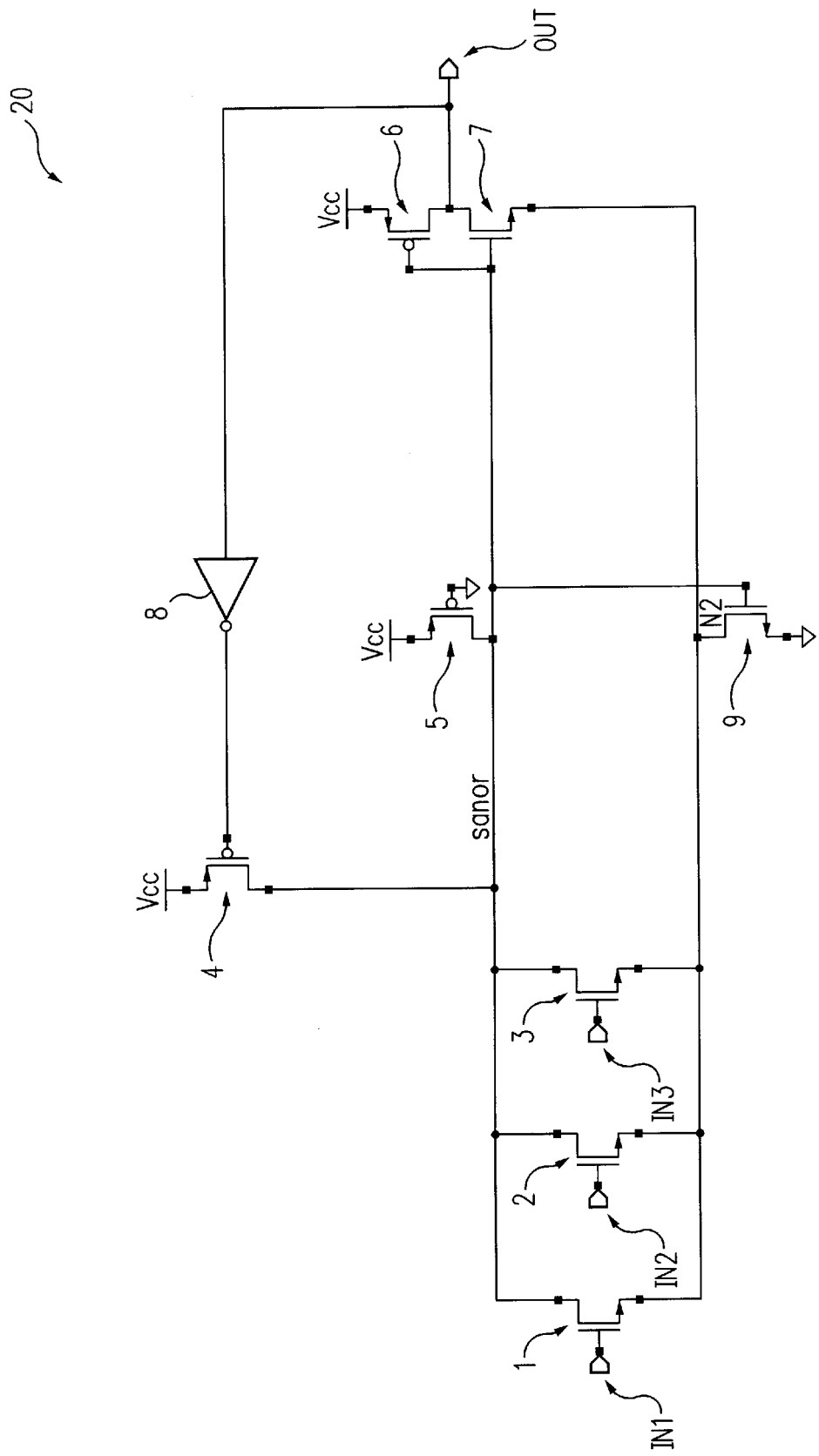
FIG. 2 shows a transistor schematic diagram of another 3-input CMOS OR circuit as known in the prior art.
Figure 3:
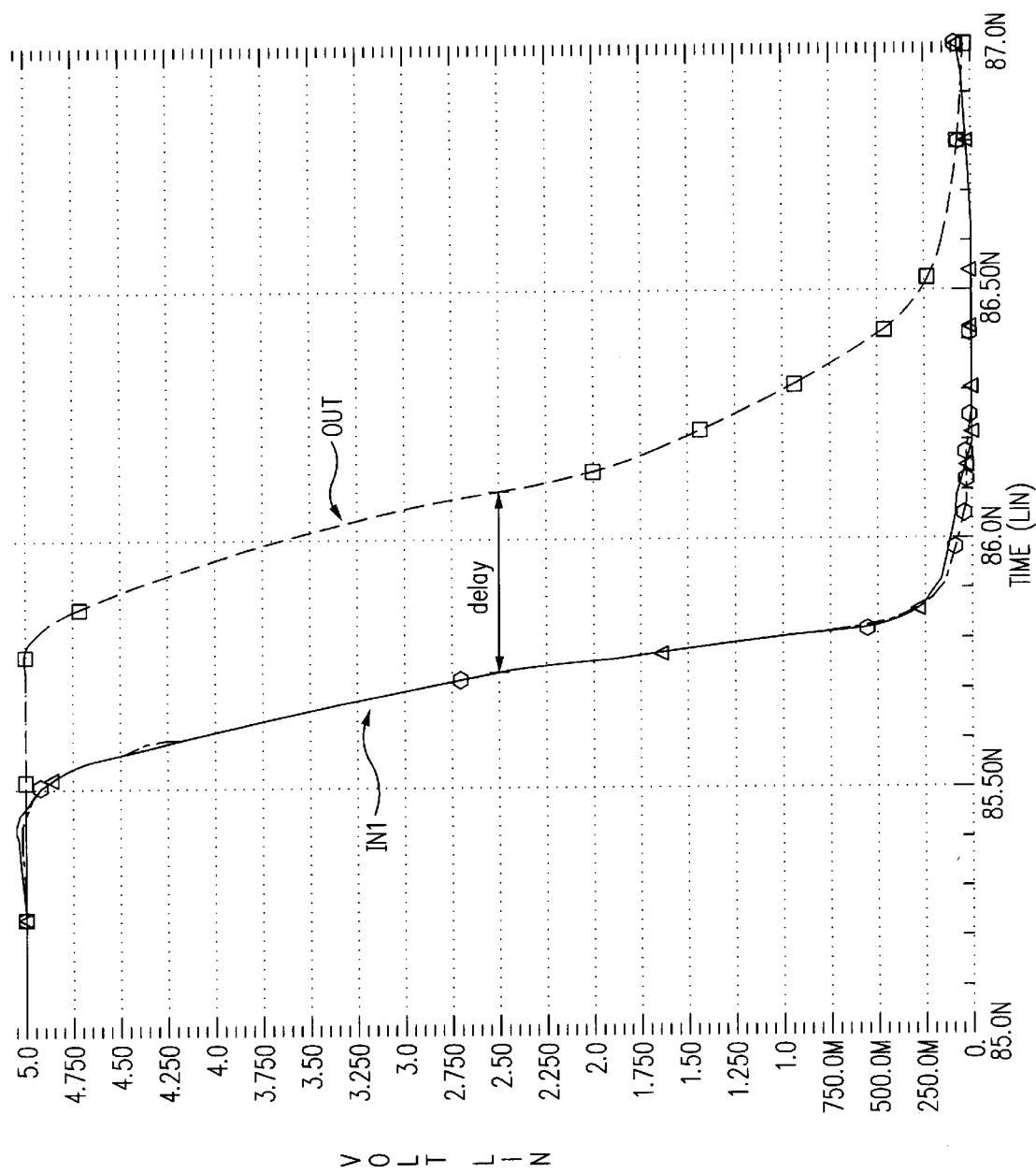
FIG. 3 shows the timing delay between an input signal and the output signal of the OR circuit of FIG. 2.
Figure 5:
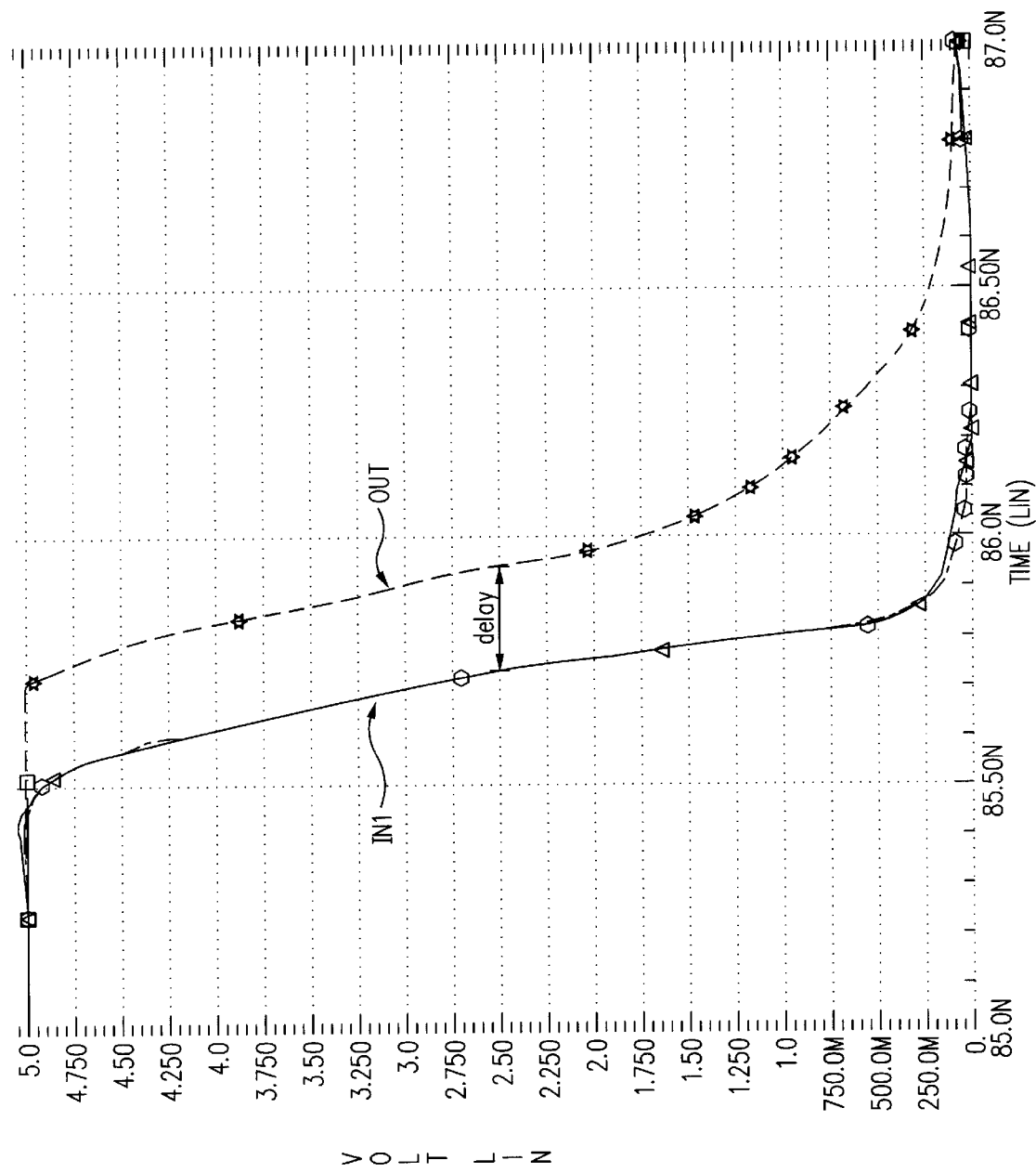
FIG. 5 shows the timing delay between an input signal and the output signal of the OR circuit of FIG. 4.

FIG. 5 shows the results of a computer simulation of the time delay between input signal IN1 and output signal OUT of OR circuit 100 using the transistor sizes in the above table, and nominal operating conditions (i.e., typical process parameters, 25° C. temperature and 5 volts supply voltage Vcc). Using the midpoint between the two supply voltages, (i.e. 2.5 volts) to measure the delay, FIG. 5 shows a delay of 0.22 nsec between the time input signal IN1 crosses 2.5 volts and the time output signal OUT crosses 2.5 volts, resulting in almost 39% improvement in speed over prior art OR circuit 20 of FIG. 2.

Figure 6:
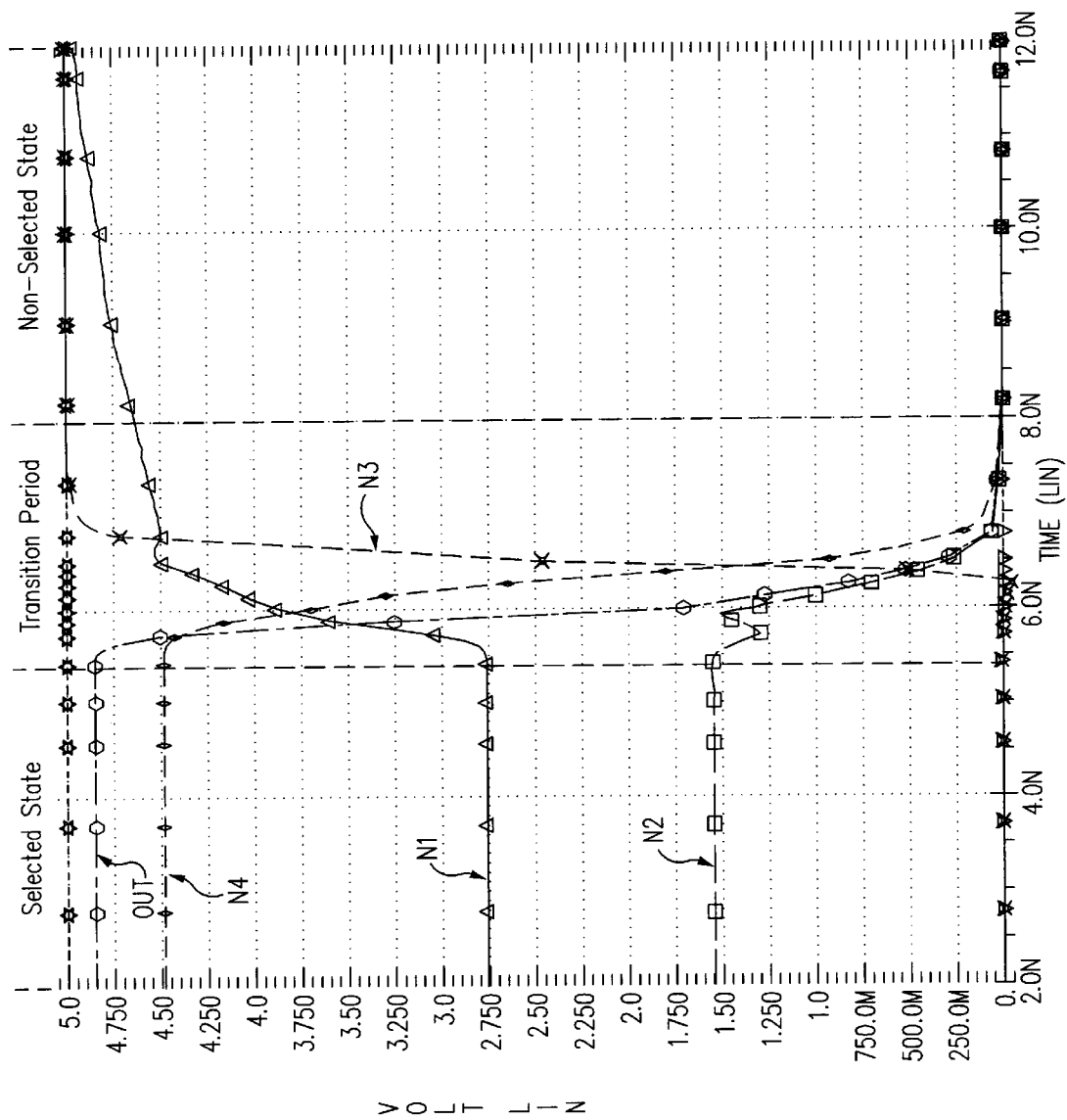
FIG. 6 shows the voltage signals at various nodes of the OR circuit of FIG. 2 as the OR circuit transitions from a selected state to a non-selected state.

FIG. 6 shows the result of a computer simulation showing the voltages of nodes N1, N2, N3, N4 and signal OUT, as OR circuit 100 transitions from a selected state (i.e. input signal IN1 is selected) to a non-selected state. While in the selected state, nodes N1 and N2 are respectively, at 2.75 and 1.5 volts. During the selected state, both PMOS transistors 1 and 3 supply current to node N1, thereby preventing this node from being pulled to the Vss voltage level. Simultaneously, node N2 is pulled above the Vss voltage level. The voltage differential between nodes N1 and N2, (i.e. approximately 1.25 volts), forces transistor 12 into a weak turn-on state, thereby preventing node N4 from reaching 5 volts. Because transistors 5, 7 and 12 are on, node N4 settles at 4.5 volts, thereby turning on transistor 16 whose source voltage is at 2.75 volts. Therefore, while in the selected state, all three transistors 1, 3 and 16 supply current to node N2.

Because the magnitude of the voltage swings on nodes N1 and N2 are kept at 2.25 volts and 1.5 volts, respectively, the time period required for charging and discharging these two nodes is relatively small, causing OR circuit 100 to be fast. At the same time, the difference of 1.25 volts appearing across nodes N1 and N2, (i.e. the gate-to-source voltage of transistor 14), induces only a weak-on state on transistor 14, thereby maintaining signal OUT at a logic high.

The channel length of NMOS transistor 10 is 0.1 $\mu$m longer than the minimum length (i.e. 0.7 $\mu$m) to substantially decrease its substrate current that would otherwise be undesirably large due to the biasing conditions and the relatively large current that flows through NMOS transistor 10.

When OR circuit 100 is in a non-selected state, nodes N1 and N3 are at 5 volts, while node N2 and N4 are at 0 volt. Therefore, both transistors 16 and 3 turn off, disconnecting the supply of currents I1 and I2 to node N1.

Figure 7:
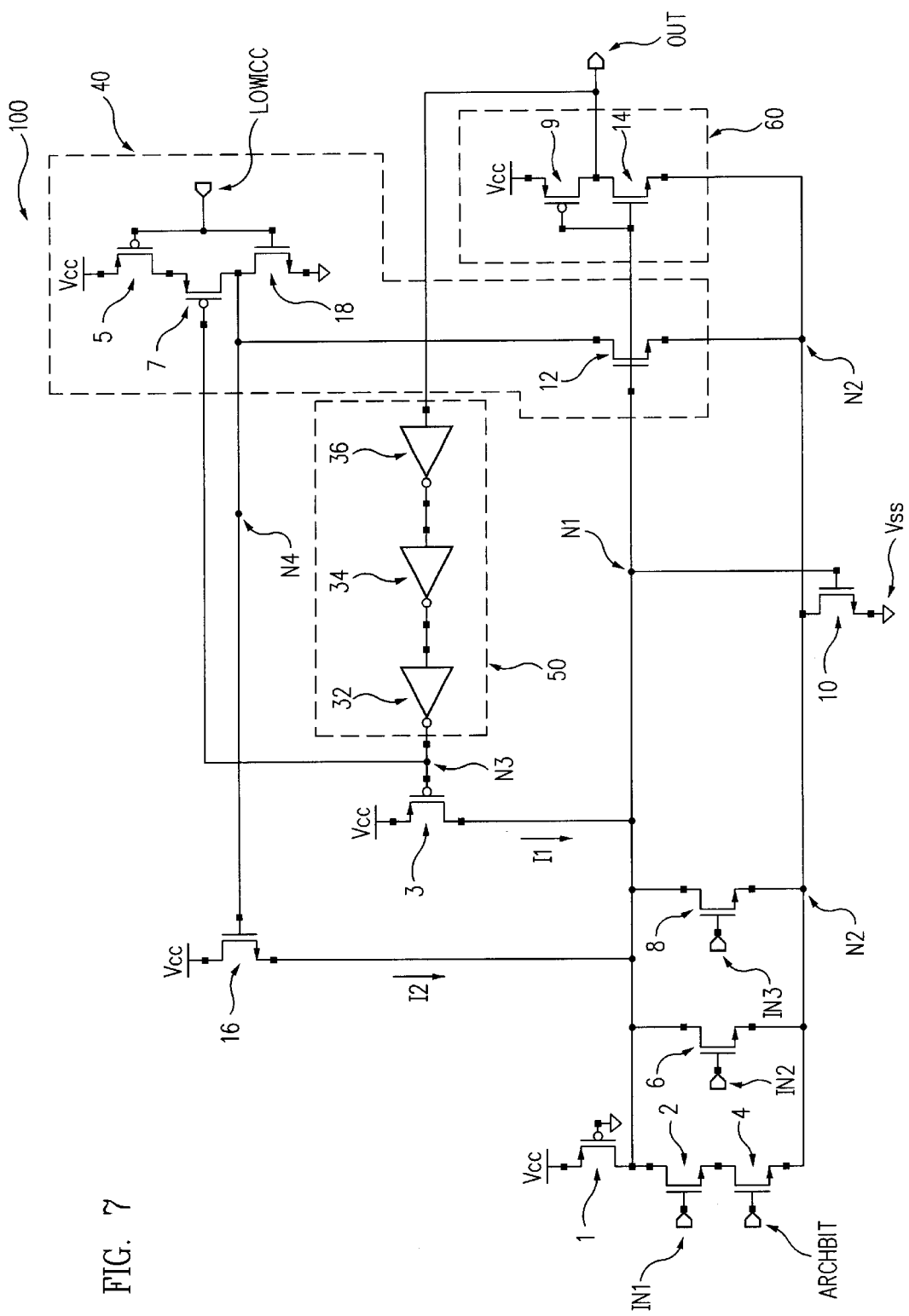
FIG. 7 shows a schematic diagram of a high-speed OR circuit, in accordance with another embodiment of the present invention.

In one embodiment of the present invention, transistor 4 is disposed between transistor 2 and node N2 to enable or disable select transistor 2, as is shown in FIG. 7. Signal ARCHBIT turns on or off NMOS transistor 4, thereby enabling or disabling logic input IN1.

The exemplary embodiments of the invention disclosed above are illustrative and not limiting. Other embodiments of this invention are possible within the scope of the appended claims.

I claim:

1. An N-input OR circuit comprising:

N select transistors each receiving an input signal voltage at its gate terminal, wherein the drain terminals of all the N select transistors are coupled to a first common node and the source terminals of all the N select transistors are coupled to a second common node; and a variable current supply for supplying a variable supply of current to the first common node, wherein the variable current supply comprises a maximum power sensor circuit for sensing the voltage differential between the first common node and the second common node and a first NMOS transistor for delivering a variable current to the first common node and having a drain terminal that is coupled to a positive voltage supply and a source terminal that is coupled to the first common node.

2. The OR circuit of claim 1 further comprising an inverter having an input terminal that is coupled to the first common node and an output terminal for providing an output voltage.

3. The OR circuit of claim 1 wherein the maximum power sensor circuit comprises a second NMOS transistor having a gate terminal coupled to the first common node, a source terminal coupled to the second common node and a drain terminal coupled to a gate terminal of the first NMOS transistor, a third NMOS transistor for receiving a LOWICC signal at its gate terminal having a source terminal that is coupled to a negative supply voltage and a drain terminal that is coupled to the drain terminal of the second NMOS transistor, a second PMOS transistor for receiving the LOWICC signal at its gate terminal having a source terminal that is coupled to the positive supply voltage, a third PMOS transistor for receiving the inverted output voltage at its gate terminal, having a source terminal that is coupled to the drain terminal of the second PMOS transistor and a drain terminal that is coupled to the drain terminal of the third NMOS transistor.

4. The OR circuit of claim 3 further comprising a fourth PMOS transistor having a gate terminal that is couple to the negative supply voltage, a source terminal coupled to the positive supply voltage and a drain terminal that is coupled to the first common nodes, and a fourth NMOS transistor having a gate terminal that is coupled to the first common node, a drain terminal that is coupled to the second common node and a source terminal that is coupled to the negative supply voltage.

5. The OR circuit of claim 4 further comprising a capacitor disposed between the gate terminal of the first NMOS transistor and the positive voltage supply.

6. A method of ORing N signals comprising:

applying each one of the N signals to a gate terminal of a different one of select transistors each having a drain terminal that is coupled to a first common node and having a source terminal that is coupled to a second common node;

supplying a variable current to the first common node, wherein supplying a variable current includes sensing the voltage differential between the first and the second common nodes at a maximum power sensor circuit and in response thereto delivering a voltage signal to a gate terminal of a first NMOS transistor having a drain terminal that is coupled to a positive voltage supply and a source terminal that is coupled to the first common node.

7. The method of claim 6 wherein the sensing step includes sensing the voltage differential between a gate terminal and a source terminal of a second NMOS transistor and delivering a voltage signal to the gate terminal of the first NMOS transistor and the drain terminals of a third NMOS transistor and a third PMOS transistor, wherein a gate terminal of the third NMOS transistor receives a LOWICC signal and a source terminal of the third NMOS transistor is coupled to the negative supply voltage, wherein a gate terminal of the third PMOS transistor receives the delayed voltage signal of the first common node and a source terminal of the third PMOS transistor is coupled to a drain terminal of a second PMOS transistor having a gate terminal that receives the LOWICC signal and a source terminal that is coupled to the positive supply voltage.

8. The method of claim 7 further comprising coupling a drain terminal of a fourth PMOS transistor having a gate terminal coupled to the negative supply voltage and a source terminal to the positive voltage supply to the first common node, and further comprising coupling a drain terminal of a fourth NMOS transistor having a gate terminal coupled to the first common node and a source terminal to the negative voltage supply to the first common node.

9. The method of claim 8 further comprising disposing a capacitor between the gate terminal of the first NMOS transistor and the positive voltage supply.

10. An N-input OR circuit comprising:

N select transistors each receiving an input signal voltage at its gate terminal, wherein the drain terminals of all the N select transistors are coupled to a first common node and the source terminals of all the N select transistors are coupled to a second common node; and a maximum power sensor circuit for sensing a voltage differential between the first common node and the second common node and, in response, controlling the amount of current that is supplied to the first common node.

11. The OR circuit of claim 10 further comprising a fixed current supply for supplying a fixed supply of current to the first common node.

12. The OR circuit of claim 10 further comprising a fixed current supply for supplying a fixed supply of current to the first common node, wherein the fixed current supply comprises a delay circuit and a transistor.

13. The OR circuit of claim 10 further comprising a fixed current supply for supplying a fixed supply of current to the first common node, wherein the fixed current supply comprises a delay circuit having an odd plurality of inverters and a transistor.

14. The OR circuit of claim 10 further comprising an inverter having an input terminal that is coupled to the first common node and an output terminal for providing an output voltage.

15. The OR circuit of claim 10 wherein the maximum power sensor circuit comprises a transistor for delivering a variable current to the first common node.

16. A method of ORing a plurality of N signals comprising:

applying each one of the N signals to a gate terminal of a different one of select transistors each having a drain terminal that is coupled to a first common node and having a source terminal that is coupled to a second common node; and supplying a variable current to the first common node, wherein supplying a variable current includes sensing the voltage differential between the first and the second common nodes at a maximum power sensor circuit and, in response, controlling the amount of current that is supplied to the first common node.

17. The method of claim 16 further comprising supplying a fixed current to the first common node.

18. The method of claim 16 further comprising supplying a fixed current to the first common node, wherein supplying the fixed current includes inverting a voltage signal of the first common node and applying a delayed voltage signal of the first common node to a gate terminal of a transistor having a source terminal coupled to a fixed voltage supply and a drain terminal coupled to the first common node.

19. The method of claim 16 wherein controlling the amount of current that is supplied to the first common node comprises delivering a voltage signal to a gate terminal of a transistor having a drain terminal coupled to the positive voltage supply and a source terminal coupled to the first common node.

* * * * *